(12) United States Patent
Jung (10) Patent No.: US 6,205,072 B1
(45) Date of Patent: Mar. 20, 2001

(54) HIGH-SPEED SENSE AMPLIFIER OF A SEMI-CONDUCTOR MEMORY DEVICE

(75) Inventor: Hoe Kwoun Jung, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/595,045

(22) Filed: Jun. 15, 2000

(30) Foreign Application Priority Data

Jun. 28, 1999 (KR) .................................................. 99-24584

(51) Int. Cl.$^7$ ...................................................... G11C 7/02
(52) U.S. Cl. ........................................... 365/207; 365/205
(58) Field of Search .................................. 365/208, 205, 365/207, 190

(56) References Cited

U.S. PATENT DOCUMENTS

| | | | |
|---|---|---|---|
| 5,162,681 | 11/1992 | Lee | 307/530 |
| 5,220,527 | 6/1993 | Ohsawa | 365/149 |
| 5,434,821 | * 7/1995 | Watanabe et al. | 365/203 |
| 5,487,048 | 1/1996 | McClure | 365/207 |
| 5,528,543 | * 6/1996 | Stieger | 365/207 |
| 5,650,980 | * 7/1997 | Sakurai et al. | 365/236 |
| 5,684,750 | * 11/1997 | Kondoh et al. | 365/205 |

FOREIGN PATENT DOCUMENTS

| | | |
|---|---|---|
| 02094096 | 4/1990 | (JP) . |
| 294096 | 4/1990 | (JP) . |

* cited by examiner

*Primary Examiner*—Richard Elms
*Assistant Examiner*—Hien Nguyen
(74) *Attorney, Agent, or Firm*—Pillsbury Winthrop LLP

(57) ABSTRACT

This invention relates to a high-speed sense amplifier of a semi-conductor memory device where a high-speed operation is possible both in a high voltage state and a low voltage state, is characterized to comprise, in a high-speed sense amplifier where a high-speed operation is possible both in the high voltage state that a power supply voltage is higher than a reference voltage and in the low voltage state that the power supply voltage is lower than the reference voltage by connecting a current mirror-type differential amplifier and an NMOS cross couple-type differential amplifier in parallel, a first amplifying part for sensing and amplifying an inputting bit signal; an equalization means for equalizing an output signal of the first amplifying part when a first sense amplifier enable signal is low; a second amplifying part having a high voltage sense amplifying part for sensing and amplifying the first amplifying signal in a high speed in a high voltage state, a low voltage sense amplifying part connected with the high voltage sense amplifying part in parallel for sensing and amplifying the first amplifying signal in a high speed in a low voltage state; an output part; a voltage generating part for generating a power supply voltage state signal; a low voltage output control part for controlling an output of the low voltage sense amplifying part by using a signal being outputted in the voltage generating part and a first sense amplifier enable signal.

11 Claims, 5 Drawing Sheets

HIGH-SPEED SENSE AMPLIFIER OF A SEMI-CONDUCTOR MEMORY DEVICE

BACKGROUND OF THE INVENTION

1. Field of the Invention

This invention relates to a high-speed sense amplifier of a semi-conductor memory device, more particularly to a high-speed sense amplifier of a semi-conductor memory device where a high-speed operation is possible both in the high voltage state that a power supply voltage is higher than a reference voltage and in the low voltage state that the power supply voltage is lower than the reference voltage by connecting a current mirror-type differential amplifier and an NMOS cross couple-type differential amplifier in parallel.

2. Description of the Related Art

Generally, a current mirror-type sense amplifier for amplifying the voltage being outputted according to a magnitude of an input voltage is comprised of a differential amplifier, the differential amplifier is comprised of a P-channel Metal Oxide Semi-conductor Transistor and an N-channel Metal Oxide Semi-conductor Transistor.

Figure 1:
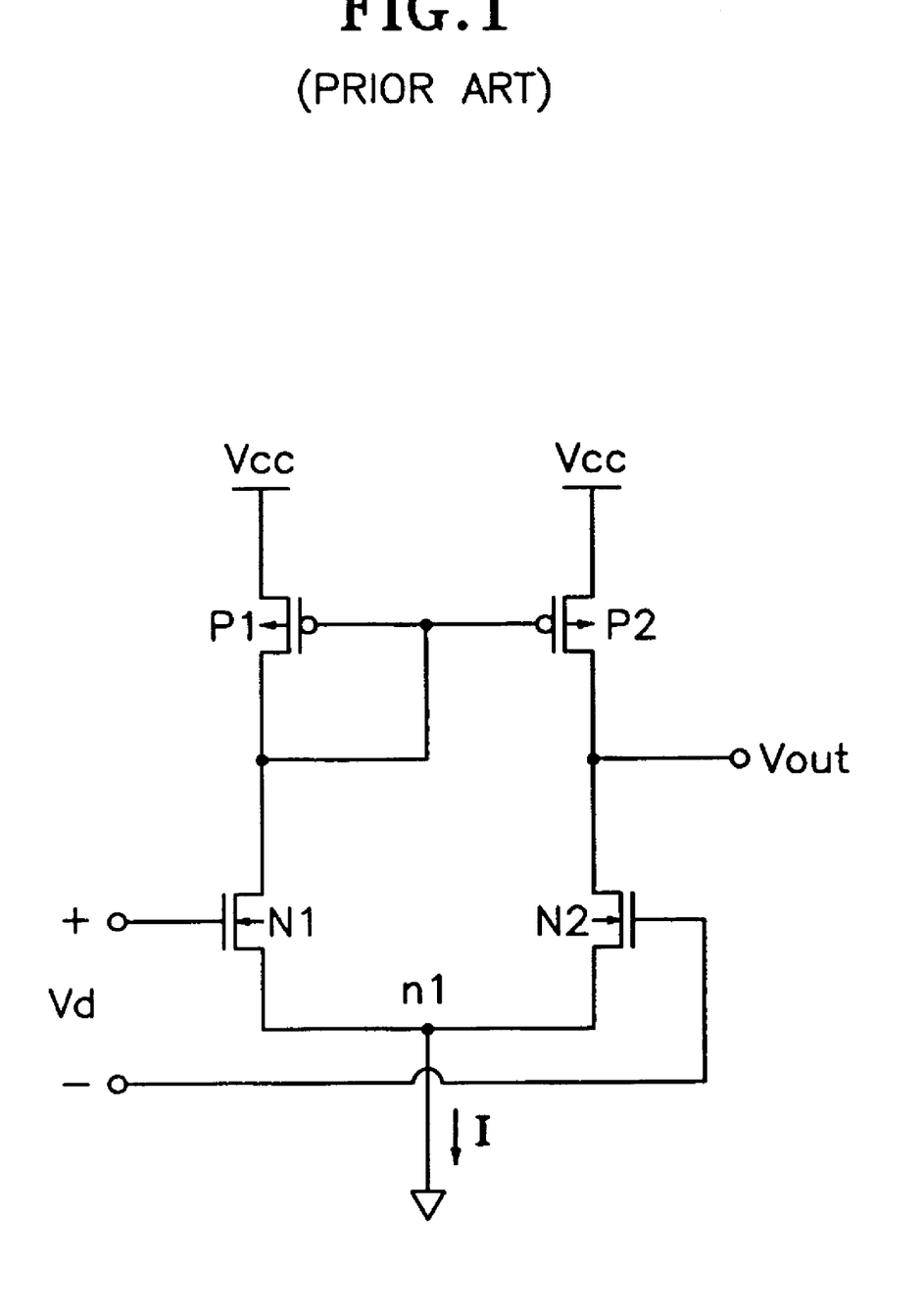
FIG. 1 is a circuit diagram showing a prior current mirror-type differential amplifier.

FIG. 1 shows a prior current mirror-type differential amplifier. The prior current mirror-type differential amplifier is comprised of a first and a second current mirror-type PMOS Transistor(P1, P2) of which sources are connected respectively to a power supply voltage(Vcc), a first and a second NMOS Transistor(N1, N2) of which drains are connected to drains of the first and the second PMOS Transistor(P1, P2) respectively.

A current of same amount flows in a drain of the first PMOS Transistor(P1) and a drain of the second PMOS Transistor(P2), so that a constant current flows in the first node(n1) connected to sources of the first and second NMOS Transistor(N1, N2).

And, An output voltage is determined by a difference between the voltages inputted to the gates of the first NMOS Transistor(N1) and the second NMOS Transistor(N2), at this time, an output voltage(Vout) is outputted in proportion to an input voltage(Vd) and an output resistance(rp2) of the second PMOS Transistor(P2) and an output resistance(rn2) of the second NMOS Transistor(N2).

Figure 2:
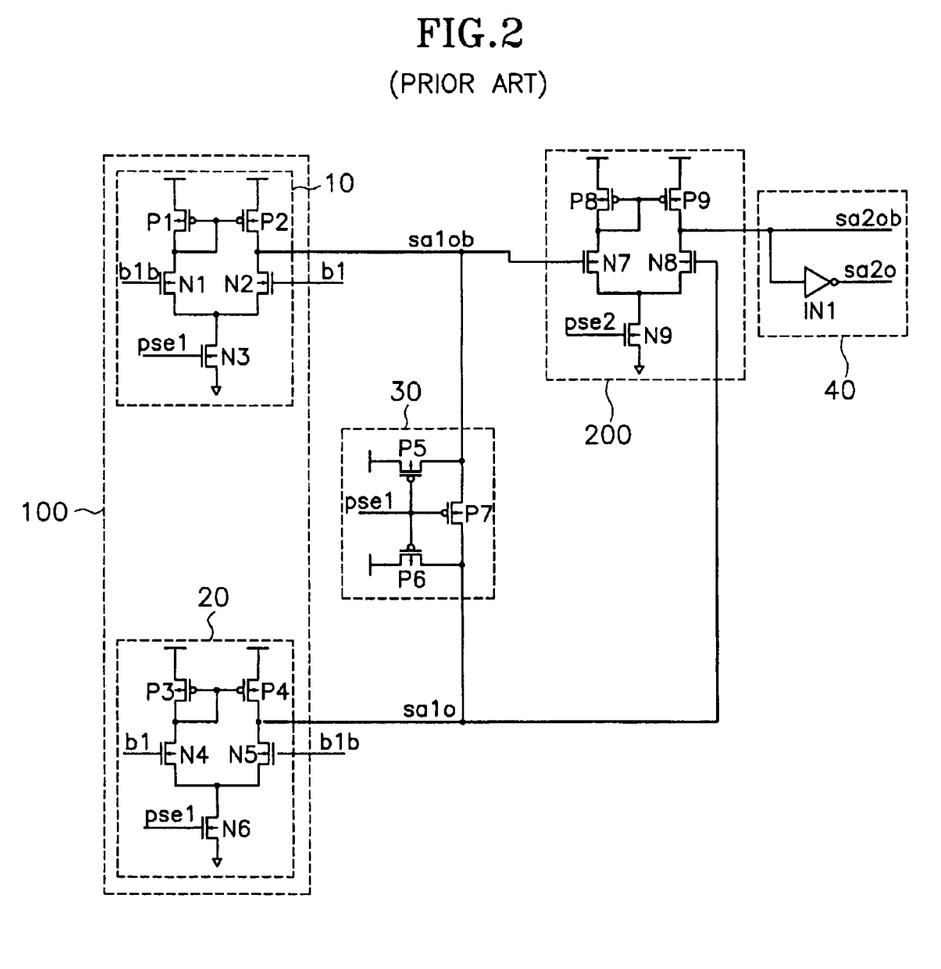
FIG. 2 is a circuit diagram showing a prior current mirror-type sense amplifier.

FIG. 2 shows a prior current mirror-type sense amplifier which has a current mirror-type differential amplifier as a component. Referring to FIG. 2, the prior current mirror-type sense amplifier comprises a first amplifying part 100 for sensing and amplifying an inputting bit signal(b1b, b1); an equalization means 30 for equalizing an output signal(sa1ob, sa1o) of the first amplifying part 300 when a first sense amplifier enable signal(pse1) is low; a second amplifying part 200 for sensing and amplifying a first amplifying signal(sa1ob, sa1o) sensed and amplified in the first amplifying part 100; an output part 40 for outputting a second amplifying signal(sa2ob, sa2o) sensed and amplified in the second amplifying part 200.

The first amplifying part 300 comprises a first current mirror-type sense amplifying part 10 and a second current mirror-type sense amplifying part 20 for sensing and amplifying a bit bar signal(b1b) and a bit signal(b1). The first current mirror-type sense amplifying part 10 outputs an inverted signal(sa1ob) among one pair of first amplifying signals(sa1ob, sa1o) by receiving the bit bar signal(b1b) and the bit signal(b1), the second current mirror-type sense amplifying part 20 outputs a non-inverted signal(sa1o) among the pair of first amplifying signals(sa1ob, sa1o) by receiving the bit bar signal(b1b) and the bit signal(b1), a composition and an operation of the first and the second current mirror-type sense amplifying part 10, 20 are same that of the current mirror-type differential amplifier indicated in FIG. 1.

However, sources of NMOS Transistors(N1, N2) are coupled to a ground power supply in the first current mirror-type sense amplifying part 10, sources of NMOS Transistors(N4, N5) are coupled to the ground power supply through a sixth NMOS Transistor(N6) in the second current mirror-type sense amplifying part 20. Only in the case that the enable signal(pse1) of a first sense amplifier is inputted to gates of the third and the sixth NMOS Transistor(N3, N6), so that the enable signal(pse1) of the first sense amplifier is inputted in a high state, an operation of sensing and amplification is performed.

In the equalization means 30, an output signal(sa10b) of the first current mirror-type sense amplifying part 10 and an output signal(sa1o) of the second current mirror-type sense amplifying part 20 are connected through a PMOS Transistor P7, the output signal(sa10b, sa1o) is inputted to PMOS Transistors P5, P6 wherein a power supply is applied to a source, the enable signal(pse1) of first sense amplifier is inputted to gates of the fifth to seventh PMOS Transistors P5, P6, P7. When the enable signal(pse1) of the first sense amplifier is inputted in a high state, the fifth to seventh PMOS Transistors P5, P6, P7 turn off, the first amplifying signal(sa1ob, sa1o) which is an output signal(sa1ob, sa1o) of the first and the second current mirror-type sense amplifying part 10, 20 is normally inputted to the second amplifying part 200. On the other hand, When the enable signal(pse1) of first sense amplifier is inputted in a low state, the second amplifying part 200 doesn't perform an operation of sensing and amplification by equalizing the first amplifying signal (sa1ob, sa1o) by way of turn on of the fifth to seventh PMOS Transistors P5, P6, P7.

The second amplifying part 200 is a part generating a second amplifying signal(sa2ob) by receiving the signal (sa1ob, sa1o) sensed and amplified in the first amplifying part 300, a composition and an operation of that is same that of the current mirror-type differential amplifier indicated in FIG. 1. But, sources of NMOS Transistors N7, N8 are connected to a ground power supply through an NMOS Transistor N9 receiving a second sense amplifier enable signal(pse2) as an input signal of a gate. Accordingly, the second amplifying part 200 performs an operation of sensing and amplification only in the case that the second sense amplifier enable signal(pse2) is inputted in a high state.

An output part 40 is composed of a terminal outputting an output signal(sa2ob) of the second amplifying part 200 as it is, an inverter IN1 for inverting and outputting the output signal(sa2ob).

If a sense amplifier enable signal(pse1) is inputted in a high state, PMOS Transistors P5, P6, P7 of an equalizing means 30 turn off, the first amplifying part 100 outputs the signal(sa1ob, sa1o) that an input signal(b1b, b1) is sensed and amplified. The second amplifying part 200 produces a second amplifying signal(sa2ob) that the amplifying signal (sa1ob, sa1o) is sensed and amplified again, so that the output part 40 outputs the second amplifying signal(sa2ob) and an inverted second amplifying signal(sa2o).

However, a prior current mirror-type sense amplifier had a problem that if a power supply is inputted in a low voltage state which is lower than a reference voltage, an output signal of the current mirror-type sense amplifier doesn't follow well and an operation speed thereof is deteriorated.

SUMMARY OF THE INVENTION

This invention is invented to solve said problem, it is an object to provide a high-speed sense amplifier where a high-speed operation is possible both in the high voltage state that a power supply voltage is higher than a reference voltage and in the low voltage state that the power supply voltage is lower than the reference voltage by connecting a current mirror-type differential amplifier and an NMOS cross couple-type differential amplifier in parallel.

To accomplish said object of this invention, this invention is characterized to comprise, in a high-speed sense amplifier where a high-speed operation is possible both in the high voltage state that a power supply voltage is higher than a reference voltage and in the low voltage state that the power supply voltage is lower than the reference voltage by connecting a current mirror-type differential amplifier and an NMOS cross couple-type differential amplifier in parallel, a first amplifying part for sensing and amplifying an inputting bit signal; an equalization means for equalizing an output signal of the first amplifying part when a first sense amplifier enable signal is low; a second amplifying part having a high voltage sense amplifying part for sensing and amplifying the first amplifying signal in a high speed in a high voltage state, a low voltage sense amplifying part connected with the high voltage sense amplifying part in parallel for sensing and amplifying the first amplifying signal in a high speed in a low voltage state; an output part composed of a first output means for outputting an output signal of the high voltage sense amplifying part when it is a high voltage state, a second output means for outputting an output signal of the low voltage sense amplifying part when it is a low voltage state; a voltage generating part for generating a power supply voltage state signal; a low voltage output control part for controlling an output of the low voltage sense amplifying part by using a signal being outputted in the voltage generating part and a first sense amplifier enable signal.

The high voltage sense amplifying part of the second amplifying part is characterized to comprise a current mirror-type differential amplifier.

The low voltage sense amplifying part of the second amplifying part is characterized to comprise an NMOS cross couple-type differential amplifier.

The second output means comprises a first and a second transmission gate, turns off the first and the second transmission gate in the low voltage state that a power supply voltage is lower than a reference voltage, outputs an output signal of the low voltage sense amplifying part.

The voltage generating part outputs a low state signal in the high voltage state that a power supply voltage is higher than a reference voltage, and outputs a high state signal in the low voltage state that the power supply voltage is lower than the reference voltage.

The low voltage output control part receives a signal being outputted in the voltage generating part and a first sense amplifier enable signal, outputs a signal for turning on the transmission gate of the second output means only when it is the low voltage state that the power supply voltage is lower than the reference voltage.

DETAILED DESCRIPTION OF THE INVENTION

Hereinafter, a preferred embodiment of the present invention will be explained in more detail with reference to the accompanying drawings.

Figure 3:
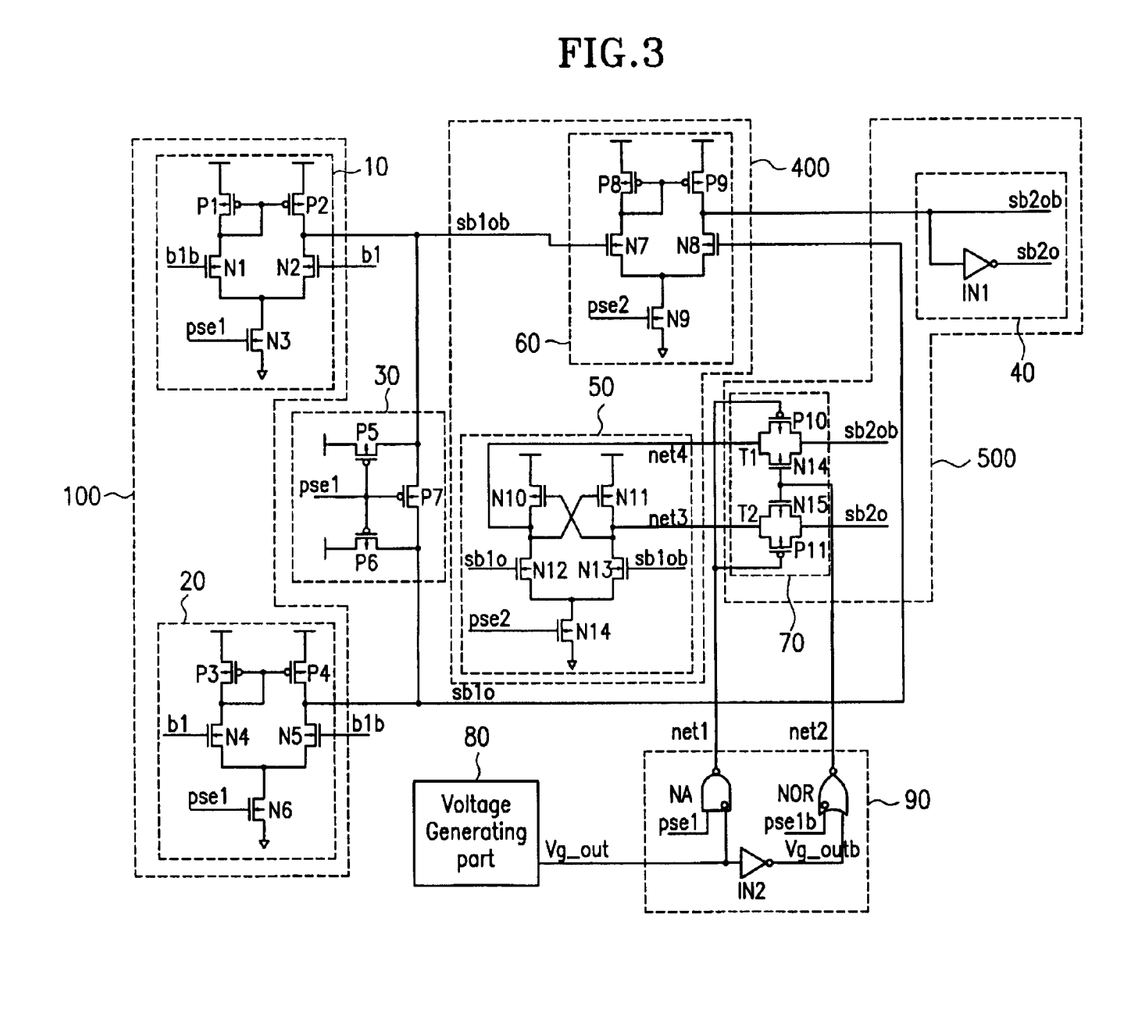
FIG. 3 is a circuit diagram showing a high speed sense amplifier of a semi-conductor memory device according to an embodiment of this invention.

FIG. 3 is a circuit diagram showing a high speed sense amplifier of a semi-conductor memory device according to an embodiment of this invention.

Reference to FIG. 3, a high speed sense amplifier according to a preferred embodiment of the present invention is characterized to comprise a first amplifying part 300 for sensing and amplifying an inputting bit signal (b1*b*, b1); an equalization means 30 for equalizing an output signal of the first amplifying part 300 when a first sense amplifier enable signal (pse1) is low; a second amplifying part 400 having a high voltage sense amplifying part 60 for sensing and amplifying the first amplifying signal (sb1*ob*, sb1*o*) in a high speed in a high voltage state, a low voltage sense amplifying part 50 connected with the high voltage sense amplifying part in parallel for sensing and amplifying the first amplifying signal (sb1*ob*, sb1*o*) in a high speed in a low voltage state; an output part 500 composed of a first output means 40 for outputting an output signal (sb2*ob*, sb2*o*) of the high voltage sense amplifying part 60 when it is a high voltage state, a second output means 70 for outputting an output signal (sb2*ob*, sb2*o*) of the low voltage sense amplifying part 50 hen it is a low voltage state; a voltage generating part 80 for generating a power supply voltage state signal (Vg_out); a low voltage output control part 90 for controlling an output of the low voltage sense amplifying art 50 by using a signal (Vg_out) being outputted in the voltage generating part 80 and a first sense amplifier enable signal (pse1, pse1*b*).

A composition and an operation of the first amplifying part 300 and the equalization means 30 are same that of the first amplifying part 300 and the equalization means 30 of a prior current mirror-type sense amplifier depicted in FIG. 2.

The high voltage sense amplifying part 60 receives the signal(sb1*ob*, sb1*o*) sensed and amplified in the first amplifying part 300, generates a second amplifying signal (sb2*ob*), a composition and an operation of that are same that of the current mirror-type differential amplifier depicted in FIG. 2. But, sources of NMOS Transistors(N7, N8) are connected to a ground power supply through an NMOS Transistor(N9) which receives a second sense amplifier enable signal (pse2) as an input signal of a gate. Thus, the high voltage sense amplifying part 60 performs an operation of sensing and amplification only in the case that the second sense amplifier enable signal (pse2) is applied in a high state.

The low voltage sense amplifying part 50 has shapes of NMOS Transistors(N10, N11) that are substituted for PMOS Transistors(P1, P2) of a differential amplifier depicted in FIG. 1, gates of the NMOS Transistors(N10, N11) are connected to drains of opponent NMOS Transistors(N10, N11), the second sense amplifier enable signal (pse2) is inputted to a gate of NMOS Transistor(N14) for controlling an operation. At this time, only in the case that the second sense amplifier enable signal (pse2) is in a high state, the low voltage sense amplifying part 50 senses and amplifies an output signal(sb1*ob*, sb1*o*) of a first amplifying part 300.

The first output means 40 comprises an inverter(INV1) for inverting an output signal(sb2*ob*) of the high voltage sense amplifying part 60, outputs the output signal(sb2*ob*) of the high voltage sense amplifying part 60 and a signal(sb2*o*) that the output signal(sb2*ob*) is inverted.

The second output means 70 is composed of a first and a second transmission gate(T1, T2), transmits an output signal (net4, net3) of the low voltage sense amplifying part 50 only in the state that a power supply voltage is lower than a reference voltage. The second output means 70 has the first and the second transmission gate(T1, T2) connected in series which have PMOS Transistors(P10, P11) and NMOS Transistors(N14, N15) connected respectively in parallel, gates of the PMOS Transistors(P10, P11) of the first and the second transmission gate(T1, T2) are connected each other, gates of the NMOS Transistors(N14, N15) of the first and the second transmission gate(T1, T2) are connected each other. The first transmission gate(T1) transmits an output signal(net4) of a tenth Transistor(N10) of a low voltage sense amplifying part 50 as an output signal(sb2*ob*) of a second amplifying part 400, the second transmission gate (T2) transmits an output signal(net3) of an eleventh Transistor(N11) of a low voltage sense amplifying part 50 as an output signal(sb2*o*) of the second amplifying part 400.

At this time, an output signal (sb2*ob*, sb2*o*) being outputted in the first output means 40 and an output signal (sb2*ob*, sb2*o*) being outputted in the second output means 70 are coupled.

The voltage generating part 80 senses a power supply voltage, outputs a low signal when the power supply voltage is higher than a reference voltage, a high signal when the power supply voltage is lower than a reference voltage to a low voltage output control part 90.

The low voltage output control part 90 has a NAND gate(NA) receiving an output signal(Vg_out) of the voltage generating part 80 and a first sense amplifier enable signal (pse1) as an input signal, a NOR gate(NOR) receiving an signal(Vg_outb) which the output signal(Vg_out) of the voltage generating part 80 is inverted through an inverter (IN2) and an inverted first sense amplifier enable signal (pse1*b*) as an input signal. An output signal(net1) of the NAND gate(NA) is inputted to gates of the PMOS Transistors(P10, P11) of the second output means 70, an output signal(net2) of the NOR gate(NOR) is inputted to gates of the NMOS Transistors(P14, P15) of the second output means 70. The low voltage output control part 90 turns on the first and the second transmission gate(T1, T2) by that the output signals(net1, net2) become low and high respectively in the case that a power supply voltage is lower than a reference voltage in an operational state that a first sense amplifier enable signal (pse1) is in a high state.

According to a high-speed sense amplifier of the present invention, all the PMOS Transistors(P5, P6, P7) of the equalization means 30 are turned on while the first sense amplifier enable signal (pse1) is applied in a high state, and the first amplifying part 300 performs an operation of sensing and amplifying of an input signal(b1*b*, b1) normally, while a second sense amplifier enable signal (pse2) is applied in a high state, and a second amplifying part 400 performs an operation of sensing and amplifying of an first amplifying signal(sb1*ob*, sb1*o*) normally. As described above, in a case that the first and the second amplifying part 300, 400 operate normally, if it is a high voltage state that a power supply voltage is higher than a reference voltage, an output signal(Vg_out) of a voltage generating part 80 becomes a low state, output signals(net1, net2) of a low voltage output control part 90 become a high and a low state respectively, so that a first and a second transmission gate (T1, T2) of a second output means 70 are turned off. Therefore, output signals(net3, net4) of a low voltage sense amplifying part 50 are cut off, an output signal(sb2*ob*) of a high voltage sense amplifying part 60 is outputted through a first output means 40.

Meanwhile, in the case that the first and the second amplifying part 300, 400 perform an amplifying operation normally, if it is a low voltage state that a power supply voltage is lower than a reference voltage, the output signal (Vg_out) of the voltage generating part 80 becomes a high state, the output signals(net1, net2) of the low voltage output control part 90 become a low and a high state respectively, so that the first and the second transmission gate(T1, T2) of the second output means 70 are turned on. As a result, the second output means 70 outputs the output signals(net3, net4) of the low voltage sense amplifying part 50 performing a high-speed operation in a low voltage state through an output part 500.

In a high voltage state that a power supply voltage is higher than a reference voltage as it is mentioned above, an output signal of a high voltage sense amplifying part 60 composed of a current mirror-type differential amplifier being able to operate in a high speed in a high voltage state is outputted, in a low voltage state that a power supply voltage is lower than a reference voltage, an output signal of a low voltage sense amplifying part 50 composed of an NMOS cross couple-type differential amplifier being able to operate in a high speed in a low voltage state is outputted, thereby a high speed operation is possible.

However, in the case that a first sense amplifier enable signal (pse1) is inputted in a low state, the first and the second current mirror-type sense amplifying part 10, 20 of the first amplifying part 300 don't perform an amplifying operation respectively, the equalization means 30 couples each other and equalizes the output signals(sb1*ob*, sb1*o*) of the first amplifying part 300, thus a first amplification isn't performed. And, in the case that a second sense amplifier enable signal (pse2) is inputted in a low state, a low voltage sense amplifying part 50 and a high voltage sense amplifying part 60 of the second amplifying part 400 don't perform an amplifying operation.

Figure 4:
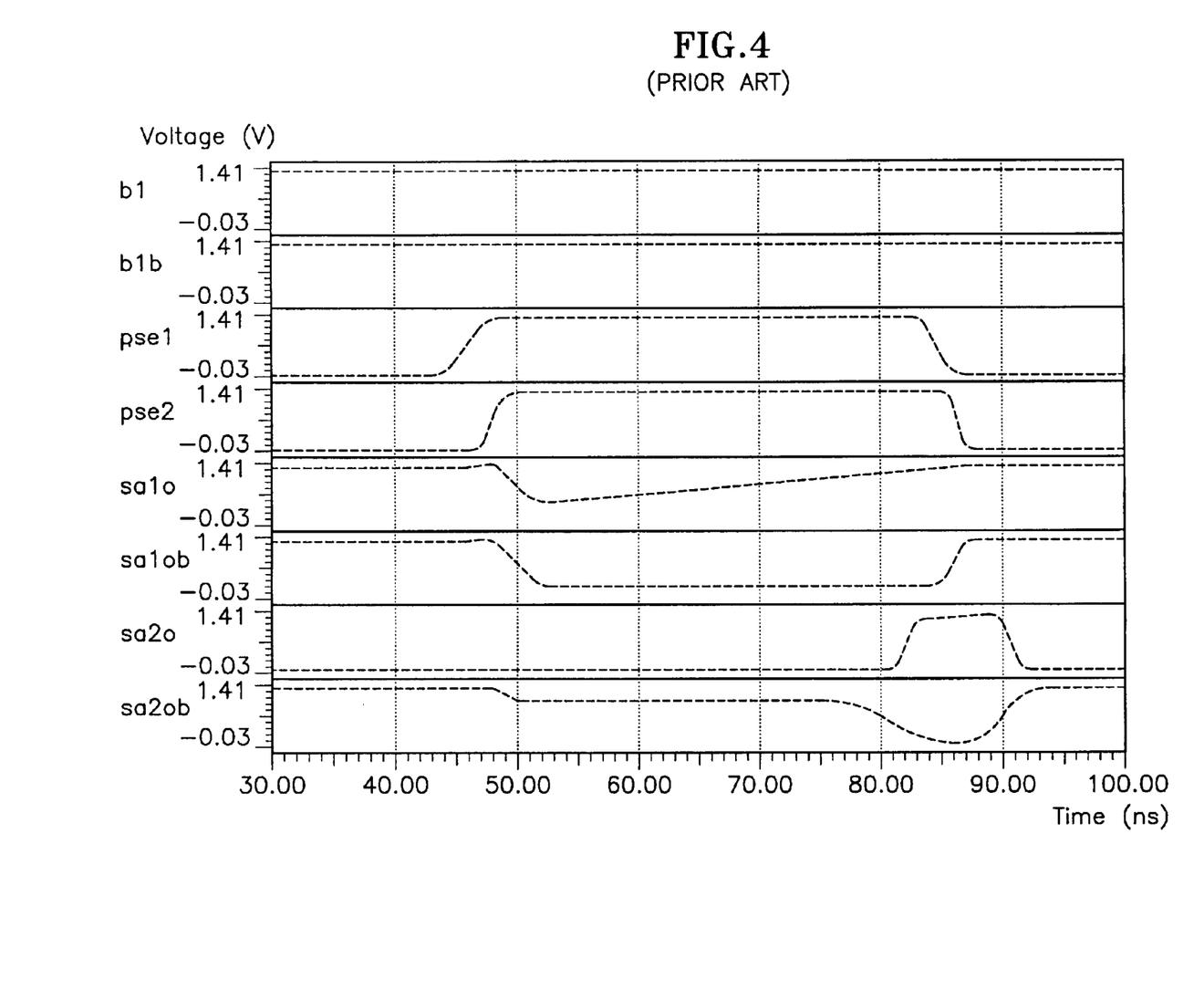
FIG. 4 is a drawing showing a simulation result of an output signal to a variation of an input signal in a prior sense amplifier, when a power supply voltage is in a low voltage state of 1.3 V.
Figure 5:
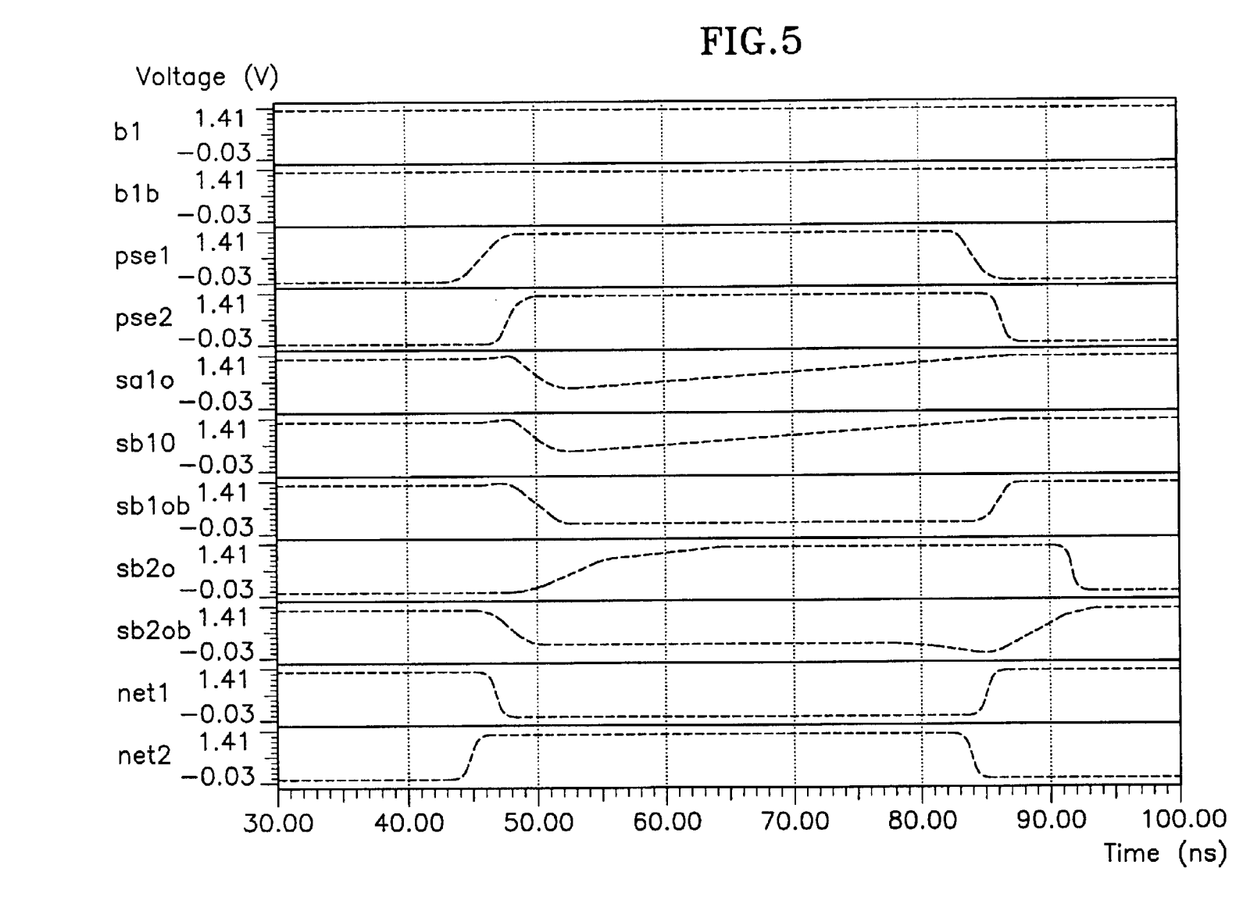
FIG. 5 is a drawing showing a simulation result of an output signal to a variation of an input signal in a high speed sense amplifier of this invention, when a power supply voltage is in a low voltage state of 1.3 V.

To see an effect according to the present invention mentioned above, when inputting signals(b1*b*, b1) are lower than a reference voltage of 1.5 V, simulation results of a prior sense amplifier and a high speed sense amplifier according to the present invention were drawn in FIG. 4 and FIG. 5.

FIG. 4 is a drawing showing a variation of an output signal in a prior sense amplifier, when a signal is inputted as a signal that a bit signal(b1) is a signal of 1.3 V and a bit bar signal(b1*b*) is a signal having a small difference of 20 mV or so compared with the bit signal(b1).

FIG. 5 is a drawing showing a variation of an output signal in a high speed sense amplifier according to this invention, in a same condition with FIG. 4.

Referring to FIG. 4, in the case that a first sense amplifier enable signal (pse1) is transited from a low state to a high state in an instant of 46 ns and a second sense amplifier enable signal (pse2) is transited from a low state to a high state in an instant of 48 ns in the state that a power supply voltage is a low voltage of 1.3 V, an output signal(sa2*ob*) of a second amplifying part 200 is outputted in an instant of 90 ns, an output signal(sa2*o*) through an inverter(IN1) is outputted in an instant of 82 ns.

On the other hand, in a high speed sense amplifier according to this invention, if a first and a second sense amplifier enable signal(pse1, pse2) are inputted in the same condition with the above, output signals(sb2ob, sb2o) of a low voltage sense amplifying part 50 through a second output means 70 are outputted respectively in an instant of 49 ns and in an instant of 53 ns.

As it is described in detail, according to a high speed sense amplifier of this invention, though a prior current mirror-type differential amplifier operates when a power supply voltage is higher than a reference voltage, an NMOS cross couple-type differential amplifier operates in a low voltage state that a power supply voltage is lower than a reference voltage, so that a voltage gain doesn't diminish even in a low voltage state and a high speed operation is possible.

Also, as the present invention can control a memory cell even if a voltage generating part and a low voltage output control part are installed one by one in one memory cell having 8 sense amplifiers, the above effect can be obtained without occupying an area largely when fabricating a circuit.

The present invention can be modified and embodied variously within the scope that doesn't depart from the major points of this invention.

What is claimed is:

1. In a high-speed sense amplifier where a high-speed operation is possible both in the high voltage state that a power supply voltage is higher than a reference voltage and in the low voltage state that the power supply voltage is lower than the reference voltage by connecting a current mirror-type differential amplifier and an NMOS cross couple-type differential amplifier in parallel, the high-speed sense amplifier of a semi-conductor memory device comprising:

a first amplifying part for sensing and amplifying an inputting bit signal;

an equalization means for equalizing an output signal of the first amplifying part when a first sense amplifier enable signal is low;

a second amplifying part having a high voltage sense amplifying part for sensing and amplifying the first amplifying signal in a high speed in a high voltage state, a low voltage sense amplifying part connected with the high voltage sense amplifying part in parallel for sensing and amplifying the first amplifying signal in a high speed in a low voltage state;

an output part composed of a first output means for outputting an output signal of the high voltage sense amplifying part when it is a high voltage state, a second output means for outputting an output signal of the low voltage sense amplifying part when it is a low voltage state;

a voltage generating part for generating a power supply voltage state signal;

a low voltage output control part for controlling an output of the low voltage sense amplifying part by using a signal being outputted in the voltage generating part and a first sense amplifier enable signal.

2. The high-speed sense amplifier of a semi-conductor memory device as claimed in claim 1, wherein the first amplifying part comprises a first current mirror-type sense amplifying part and a second current mirror-type sense amplifying part for sensing and amplifying a bit bar signal and a bit signal.

3. The high-speed sense amplifier of a semi-conductor memory device as claimed in claim 2, wherein the first current mirror-type sense amplifying part comprises:

a first and a second current mirror-type PMOS Transistor of which sources are connected respectively to a power supply voltage, of which gates are connected each other;

a first and a second NMOS Transistor of which drains are connected to drains of the first and the second PMOS Transistor each other;

a third NMOS Transistor of which drain is connected to sources of the first and the second NMOS Transistor;

a first sense amplifier enable signal is inputted to a gate of the third NMOS Transistor, a source of the third NMOS Transistor is connected to a ground power supply, a bit bar signal and a bit signal are inputted respectively to gates of the first and the second NMOS Transistor, the first current mirror-type sense amplifying part senses and amplifies the bit bar signal and a bit signal.

4. The high-speed sense amplifier of a semi-conductor memory device as claimed in claim 2, wherein the second current mirror-type sense amplifying part comprises:

a first and a second current mirror-type PMOS Transistor of which sources are connected respectively to a power supply voltage, of which gates are connected each other;

a first and a second NMOS Transistor of which drains are connected to drains of the first and the second PMOS Transistor each other;

a third NMOS Transistor of which drain is connected to sources of the first and the second NMOS Transistor;

a first sense amplifier enable signal is inputted to a gate of the third NMOS Transistor, a source of the third NMOS Transistor is connected to a ground power supply, a bit signal and a bit bar signal are inputted respectively to gates of the first and the second NMOS Transistor, the second current mirror-type sense amplifying part senses and amplifies the bit signal and the bit bar signal.

5. The high-speed sense amplifier of a semi-conductor memory device as claimed in claim 1, wherein the equalization means is characterized that an output signal of the first current mirror-type sense amplifying part and an output signal of the second current mirror-type sense amplifying part are connected through the PMOS Transistor, and that output signals of the first and the second current mirror-type sense amplifying part (sa10b, sa1o) are inputted to a fifth and a sixth PMOS Transistor wherein a power supply is applied to a source, and that a first sense amplifier enable signal is inputted to gates of the fifth to seventh PMOS Transistor.

6. The high-speed sense amplifier of a semi-conductor memory device as claimed in claim 1, wherein the high voltage sense amplifying part of the second amplifying part comprises:

a first and a second current mirror-type PMOS Transistor of which sources are connected respectively to a power supply voltage, of which gates are connected each other;

a first and a second NMOS Transistor of which drains are connected to drains of the first and the second PMOS Transistor each other;

a third NMOS Transistor of which drain is connected to sources of the first and the second NMOS Transistor;

a second sense amplifier enable signal is inputted to a gate of the third NMOS Transistor, a source of the third NMOS Transistor is connected to a ground power supply, output signals of the first current mirror-type sense amplifying part and the second current mirror-type sense amplifying part are inputted respectively to gates of the first and the second NMOS Transistor, the high voltage sense amplifying part of the second amplifying part is a current mirror-type differential amplifier sensing and amplifying the output signals.

7. The high-speed sense amplifier of a semi-conductor memory device as claimed in claim 1, wherein the low voltage sense amplifying part of the second amplifying part comprises:

a first and a second cross couple-type NMOS Transistor of which sources are connected respectively to a power supply, of which gates are connected to drains of NMOS Transistors being opponent in a cross shape;

a third and a fourth NMOS Transistor of which drains are connected to drains of the first and the second NMOS Transistor each other;

a fifth NMOS Transistor of which drain is connected to sources of the third and the fourth NMOS Transistor;

the second sense amplifier enable signal is inputted to a gate of the fifth NMOS Transistor, a source of the fifth NMOS Transistor is connected to a ground power supply, output signals of the first current mirror-type sense amplifying part and the second current mirror-type sense amplifying part are inputted respectively to gates of the third and the fourth NMOS Transistor, the low voltage sense amplifying part of the second amplifying part is a cross couple-type differential amplifier sensing and amplifying the output signals.

8. The high-speed sense amplifier of a semi-conductor memory device as claimed in claim 1, wherein the first output means outputs the output signal of the high voltage sense amplifying part and a signal that the output signal is inverted through an inverter.

9. The high-speed sense amplifier of a semi-conductor memory device as claimed in claim 1, wherein the second output means comprises a first and a second transmission gate connected in series which have PMOS Transistors and NMOS Transistors connected respectively in parallel, gates of the PMOS Transistors of the first and the second transmission gate are connected each other, gates of the NMOS Transistors of the first and the second transmission gate are connected each other, transmits an output signal of the low voltage sense amplifying part through the first and the second transmission gate.

10. The high-speed sense amplifier of a semi-conductor memory device as claimed in claim 1, wherein the voltage generating part senses a power supply voltage, outputs a low signal when the power supply voltage is higher than a reference voltage, a high signal when the power supply voltage is lower than a reference voltage to the low voltage output control part.

11. The high-speed sense amplifier of a semi-conductor memory device as claimed in claim 1, wherein the low voltage output control part comprises:

a NAND gate receiving an output signal of the voltage generating part and a first sense amplifier enable signal as an input signal;

a NOR gate receiving an signal which the output signal of the voltage generating part is inverted and an inverted first sense amplifier enable signal as an input signal;

an output signal of the NAND gate is inputted to gates of the PMOS Transistors of the second output means, an output signal of the NOR gate is inputted to gates of the NMOS Transistors of the second output means.

* * * * *